(12) United States Patent
Ooi et al.

(10) Patent No.: US 9,871,498 B2
(45) Date of Patent: Jan. 16, 2018

(54) RF INTERFERENCE CHOKE DEVICE AND RF TESTING APPARATUS INCORPORATING THE SAME

(71) Applicant: Jabil Circuit (Singapore) Pte., Ltd., Singapore (SG)

(72) Inventors: Tze-Meng Ooi, Singapore (SG); Khai-Siang Chua, Singapore (SG)

(73) Assignee: Jabil Circuit (Singapore) Pte., Ltd., Singapore (SG)

( * ) Notice: Subject to any disclaimer, the term of this patent is extended or adjusted under 35 U.S.C. 154(b) by 117 days.

(21) Appl. No.: 15/074,500

(22) Filed: Mar. 18, 2016

(65) Prior Publication Data
US 2016/0276996 A1    Sep. 22, 2016

(30) Foreign Application Priority Data
Mar. 20, 2015   (SG) .......................... 10201502185Q

(51) Int. Cl.
*H03H 1/00* (2006.01)
*G01R 29/08* (2006.01)
*G01R 29/10* (2006.01)

(52) U.S. Cl.
CPC ....... *H03H 1/0007* (2013.01); *G01R 29/0878* (2013.01); *G01R 29/10* (2013.01)

(58) Field of Classification Search
CPC .. G01R 1/0408; G01R 1/0433; G01R 1/0483; G01R 1/07314; G01R 31/26; G01R 31/2808; G01R 31/2886; G01R 1/0466; G01R 31/2879; G01R 31/2889; G01R 31/2896; G01R 29/0878; G01R 29/10; H03H 1/0007; H05K 1/14; H05K 1/0243; H01P 3/00; H01P 3/02; H01P 3/04; H01P 3/06; H01P 3/003; H01P 3/026; H01P 3/08; H01P 5/028; H01P 1/005; H01P 3/12; H01P 3/16; H01P 5/024; H01P 5/082; H01P 5/087; H01P 5/1022
USPC ................. 324/756.01, 756.02; 333/245–263
See application file for complete search history.

(56) References Cited

U.S. PATENT DOCUMENTS

| | | | | |
|---|---|---|---|---|
| 4,970,522 A | * | 11/1990 | Niman ................. | H01Q 21/064 333/237 |
| 5,982,255 A | * | 11/1999 | Tanizaki ................ | H01P 3/165 333/239 |
| 2011/0109341 A1 | * | 5/2011 | Schmegner .......... | G01R 1/0408 324/756.05 |

* cited by examiner

*Primary Examiner* — Tung X Nguyen
*Assistant Examiner* — Robert P Alejnikov, Jr.
(74) *Attorney, Agent, or Firm* — Volpe and Koenig, P.C.

(57) ABSTRACT

A radio frequency (RF) interference choke device includes a planar dielectric board formed with two first slots and two second slots that extend in a lengthwise direction of the dielectric board. The first/second slots are arranged symmetrically about a central line of the dielectric board parallel to the lengthwise direction, and have a first/second length associated with a first/second frequency band. A metal layer is attached to the dielectric board, and has a U-shaped first pattern surrounding the first slots, a U-shaped second pattern surrounding the second slots, and a strip-shaped third pattern extending along the central line and interconnecting the first and second patterns.

22 Claims, 14 Drawing Sheets

US 9,871,498 B2

RF INTERFERENCE CHOKE DEVICE AND RF TESTING APPARATUS INCORPORATING THE SAME

CROSS REFERENCE TO RELATED APPLICATION

This application claims priority of Singaporean Application No. 10201502185Q, filed on Mar. 20, 2015, which is incorporated by reference as if fully set forth.

FIELD OF INVENTION

The disclosure relates to radio frequency (RF) technology, and more particularly to an RF interference choke and an RF testing apparatus for reducing transmission of RF interference signals.

BACKGROUND

Conventional radio frequency (RF) choke device is a conductive metal tube for reducing transmission of RF interference signals which have frequencies within a single specific frequency band. The conductive metal tube is used to be sleeved on a coaxial cable in a lengthwise direction parallel to the coaxial cable and has a length substantially equal to quarter of a wavelength of a center frequency of the specific frequency band.

SUMMARY

Therefore, an object of the present disclosure is to provide an RF interference choke device that can reduce transmission of RF interference signals having frequencies within two different frequency bands.

According to one aspect of the present disclosure, there is provided a radio frequency (RF) interference choke device for reducing transmission of RF interference signals originating from outside of a coaxial cable and each having a frequency within one of a first frequency band and a second frequency band that are different from each other. The RF interference choke device includes a planar dielectric board, and a metal layer that is attached to the dielectric board.

The planar dielectric board has a first board portion, a second board portion that is opposite to the first board portion in a lengthwise direction of the dielectric board, and a third board portion that interconnects the first and second board portions. The first board portion is formed with two elongate first slots that extend in the lengthwise direction, that are arranged symmetrically about a central line of the dielectric board parallel to the lengthwise direction and that have a first length associated with the first frequency band. The second board portion is formed with two elongate second slots that extend in the lengthwise direction, that are arranged symmetrically about the central line and that have a second length associated with the second frequency band. The third board portion is defined among the first and second slots.

The metal layer is used to connect with the coaxial cable and has a U-shaped first pattern that is disposed on the first board portion and that surrounds the first slots, a U-shaped second pattern that is disposed on the second board portion and that surrounds the second slots, and a strip-shaped third pattern that extends along the central line and that interconnects integrally the first and second patterns.

According to another aspect of the present disclosure, an RF testing apparatus is used for an electronic device under test (DUT) that includes an antenna element unit. The RF testing apparatus includes a platform, an impedance matching circuit board, and at least one RF interference choke device.

The platform is used to support the electronic DUT thereon. The impedance matching circuit board is mounted to the platform and used to be electrically connected to the antenna element unit of the electronic DUT when the electronic DUT is disposed on the platform for providing impedance matching between the antenna element unit and at least one coaxial cable. The at least one cable is electrically connected to the impedance matching circuit board to serve as a transmission line for signals transmitted to or outputted from the antenna element unit of the electronic DUT.

The at least one RF interference choke device is mounted to the at least one coaxial cable for reducing transmission of RF interference signals originating from outside the at least one coaxial cable and each having a frequency within one of a first frequency band and a second frequency band that are different from each other. Each of said at least one RF interference choke device includes a planar dielectric board and a metal layer that is attached to the dielectric board.

The planar dielectric board has a first board portion, a second board portion that is opposite to the first board portion in a lengthwise direction of the dielectric board, and a third board portion that interconnects the first and second board portions. The first board portion is formed with two elongate first slots that extend in the lengthwise direction, that are arranged symmetrically about a central line of the dielectric board parallel to the lengthwise direction and that have a first length associated with the first frequency band. The second board portion is formed with two elongate second slots that extend in the lengthwise direction, that are arranged symmetrically about the central line and that have a second length associated with the second frequency band. The third board portion is defined among said first and second slots.

The metal layer connects with a respective one of the at least one coaxial cable. The metal layer has a U-shaped first pattern that is disposed on the first board portion and that surrounds the first slots, a U-shaped second pattern that is disposed on the second board portion and that surrounds the second slots, and a strip-shaped third pattern that extends along the central line and that interconnects integrally the first and second patterns.

BRIEF DESCRIPTION OF THE DRAWINGS

Other features and advantages of the present disclosure will become apparent in the following detailed description of the embodiment(s) with reference to the accompanying drawings, of which.

DETAILED DESCRIPTION OF THE PREFERRED EMBODIMENTS

Figure 1:
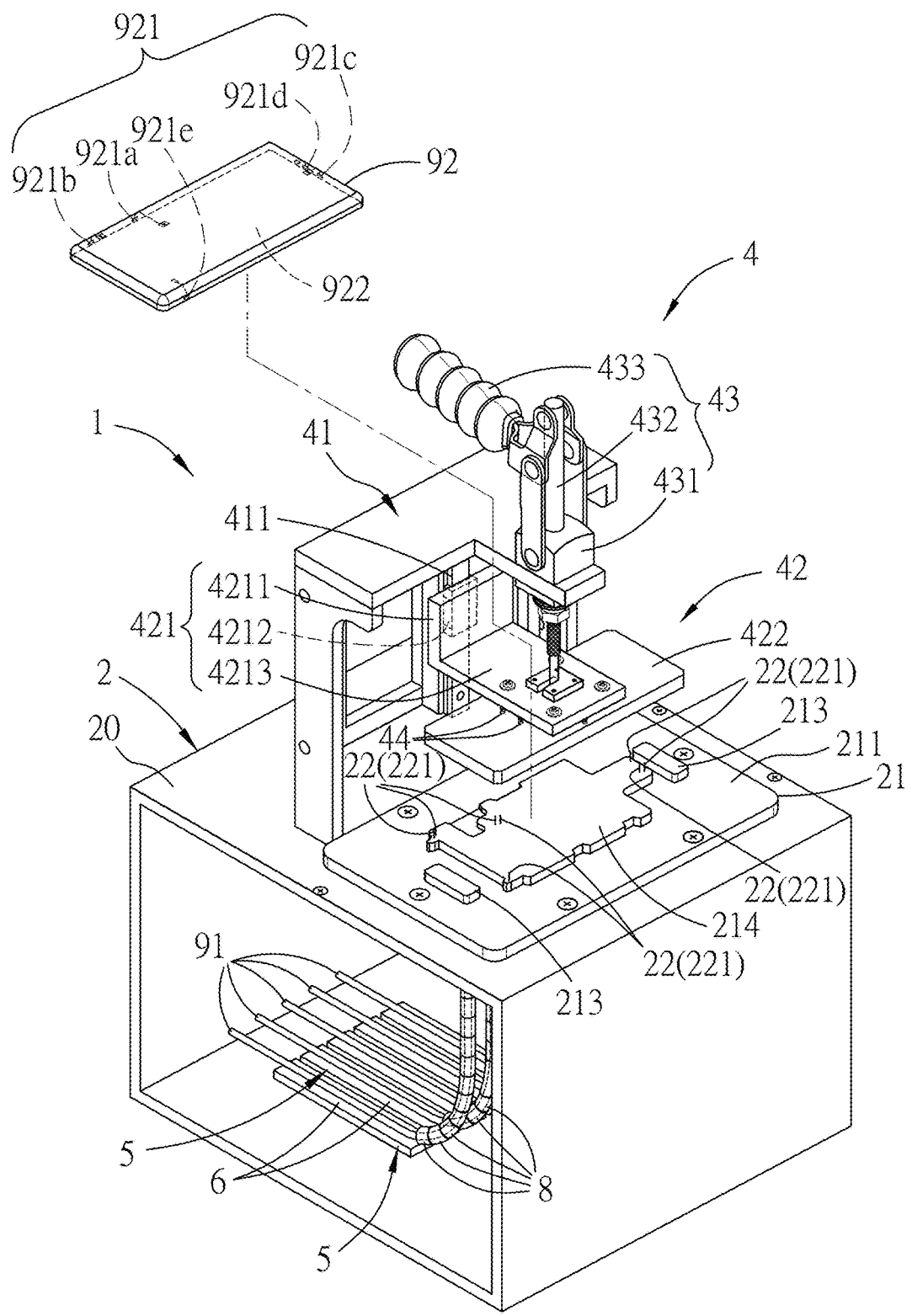
FIG. 1 is a perspective view showing the embodiment of an RF testing apparatus according to the present invention, and an electronic DUT.

Referring to FIGS. 1 to 4, the embodiment of a radio frequency (RF) testing apparatus 1 according to the present invention is shown to be used to test an electronic device under test (DUT) 92. The electronic DUT 92 includes an antenna element unit 921 to be tested. In this embodiment, the electronic DUT 92 is, but not limited to, a housing part of a mobile phone that is mounted with, for example, five antenna elements (921a), (921b), (921c), (921d) and (921e) cooperatively serving as the antenna element unit 921. In addition, the electronic DUT 92 is formed with a recess 922. The RF testing apparatus 1 includes a platform 2, an impedance matching circuit board 3, a press mechanism 4, a plurality of RF interference choke devices 5, and a plurality of coaxial cables 91.

The platform 2 is used to support the electronic DUT 92 thereon. In this embodiment, the platform 2 includes a tabletop 20 formed with an opening (not shown), and a carrier plate 21 disposed on the tabletop 20 for covering the opening. The carrier plate 21 has a top surface 211 used to support the electronic DUT 92 thereon, and a bottom surface 212 opposite to the top surface 211. It is noted that the carrier plate 21 is formed at the top surface 211 with, for example, a primary positioning protrusion 214 and two opposite auxiliary positioning protrusions 213 that are arranged in a manner that the primary positioning protrusion 214 is used to fittingly engage the recess 922 in the electronic DUT 92 and that the electronic DUT 92 is positioned between the auxiliary positioning protrusions 213 (see FIG. 3). The carrier plate 21 is provided with a plurality of resilient terminals 22, such as pogo pins. Each resilient terminal 22 extends through the carrier plate 21, and has an upper end 221, for example, which extends out of a top surface of the primary positioning protrusion 214 of the carrier plate 21 (see FIG. 1), and a lower end 222 (see FIG. 5), which extends out of the bottom surface 212 of the carrier plate 21. It is noted that arrangement of the resilient terminals 22 is associated with the arrangement of the antenna element unit 921 of the electronic DUT 92. As a result, when the electronic DUT 92 is mounted to the carrier plate 21, each resilient terminal 22 electrically contacts a corresponding antenna element (921a), (921b), (921c), (921d), (921e). In addition, the carrier plate 21 may be replaced to conform to different electronic DUTs.

The impedance matching circuit board 3 is mounted to the platform 2 and used to be electrically connected to the antenna element unit 921 of the electronic DUT 92 when the electronic DUT 92 is disposed on the platform 2 for providing impedance matching between the antenna element unit 921 and the five coaxial cables 91, which are electrically connected to the impedance matching circuit board 3 to serve as a transmission line for signals transmitted to or outputted from the antenna element unit 921 of the electronic DUT 92.

Figure 2:
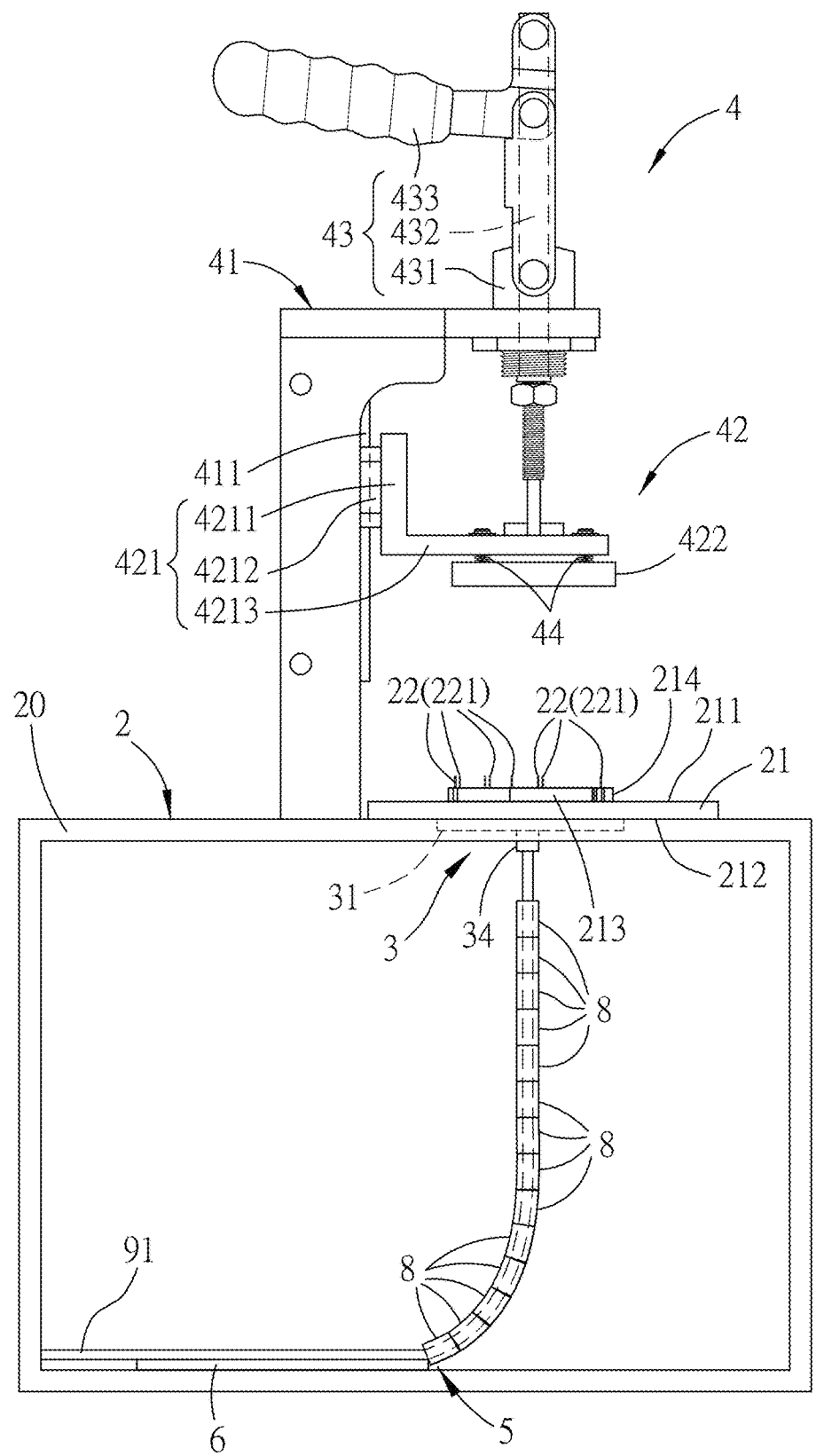
FIG. 2 is a schematic side view of the embodiment.
Figure 5:
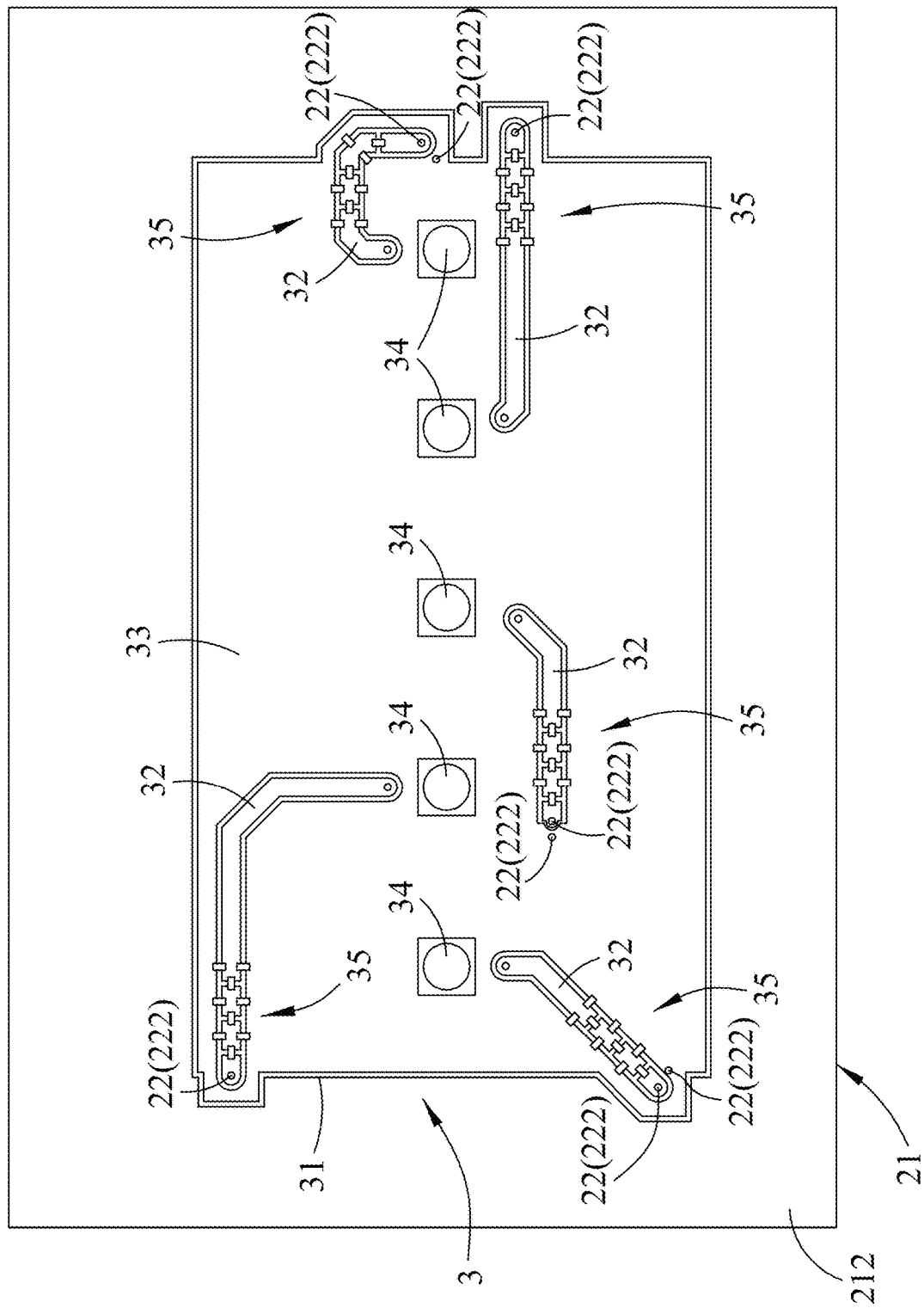
FIG. 5 is a schematic bottom view showing a carrier plate of the embodiment attached with an impedance matching circuit board.

Referring to FIGS. 2 and 5, the impedance matching circuit board 3 includes a circuit board 31 and a plurality of lumped component units 35. The circuit board 31 is fixed to the bottom surface 212 of the carrier plate 21. The circuit board 31 has a side surface, i.e., a bottom surface that is formed with a plurality of spaced apart conductive traces 32 and a ground pattern 33 spaced apart from the conductive traces 32. The circuit board 31 is provided with a plurality of electrical connectors 34, for example, SubMiniature version A (SMA) connectors, on its bottom surface. Each electrical connector 34 interconnects electrically a respective one of the conductive traces 32 and a respective one of the coaxial cables 91 (see FIG. 1). In this embodiment, the circuit board 31 is substantially rectangular, and permits extension of the lower ends 222 of the resilient terminals 22 therethrough. In order to reduce noise, the electrical connectors 34 may be arranged along a central line in a lengthwise direction of the circuit board 31. In addition, the conductive traces 32 may be arranged in a manner that the lower end 222 of each resilient terminal 22 extending through the circuit board 31 is connected electrically to a corresponding one of the conductive traces 32 or connected electrically to the ground pattern 33. Each lumped component unit 35 is connected electrically to a respective conductive trace 32 and the ground pattern 33, and includes a plurality of electronic components, each of which may be one of a capacitor, an inductor and a resistor. In this embodiment, some electronic components are in series and some electronic components are in parallel. The parallel configuration is connected to the ground pattern 33.

Referring again to FIGS. 1 to 4, the press mechanism 4 is disposed on the platform 2 for pressing, when testing, the electronic DUT 92 in a manner that the upper ends 221 of the resilient terminals 22 contact tightly the antenna element unit 921 of the electronic DUT 92. In this embodiment, the press mechanism 4 includes a supporting frame 41, a press plate unit 42 and an actuating unit 43.

The supporting frame 41 is disposed on the tabletop 20 of the platform 2, and includes an uprightly extending guiding rail member 411.

Figure 3:
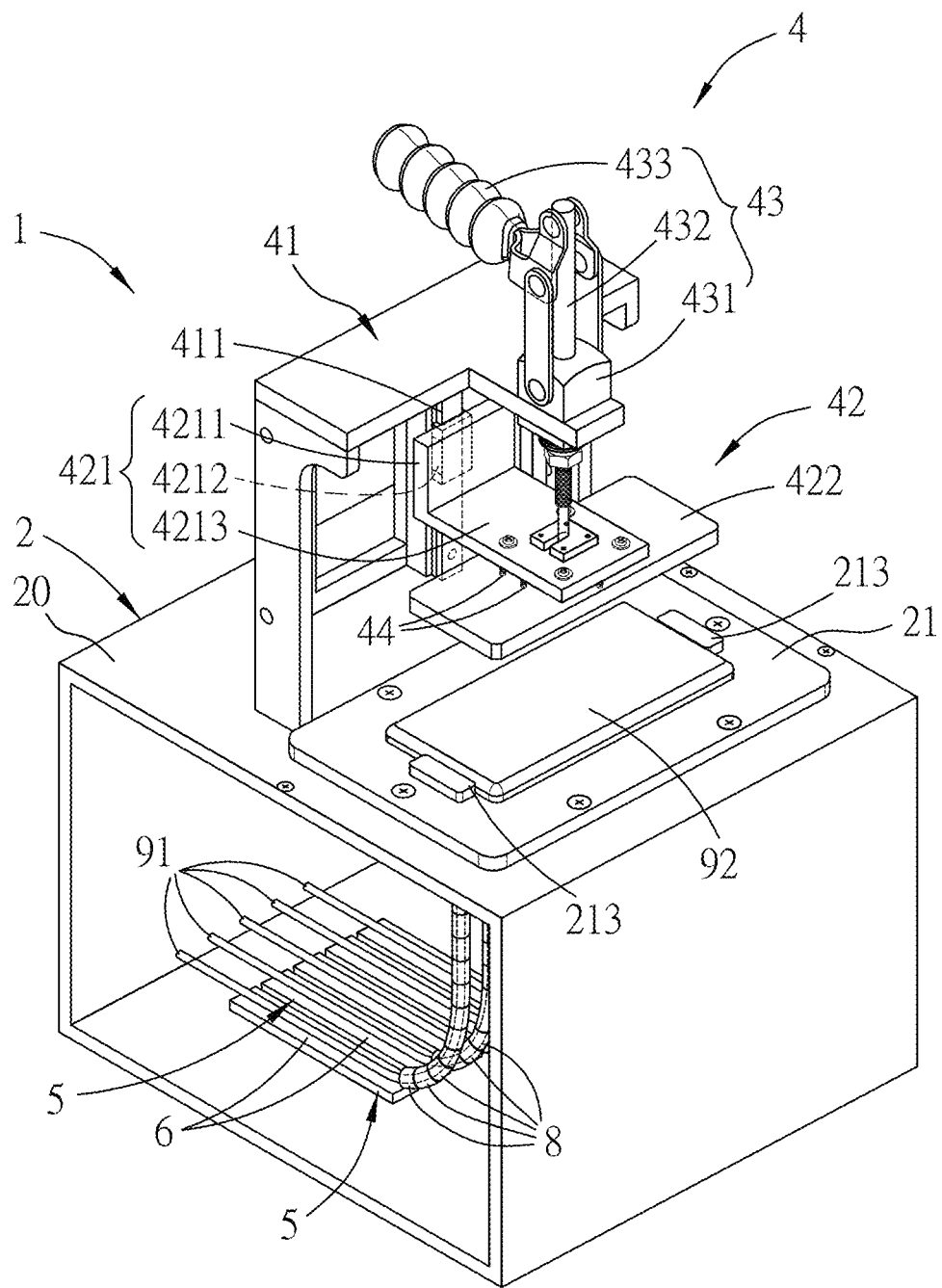
FIG. 3 is a perspective view showing the embodiment when mounted with the electronic DUT.
Figure 4:
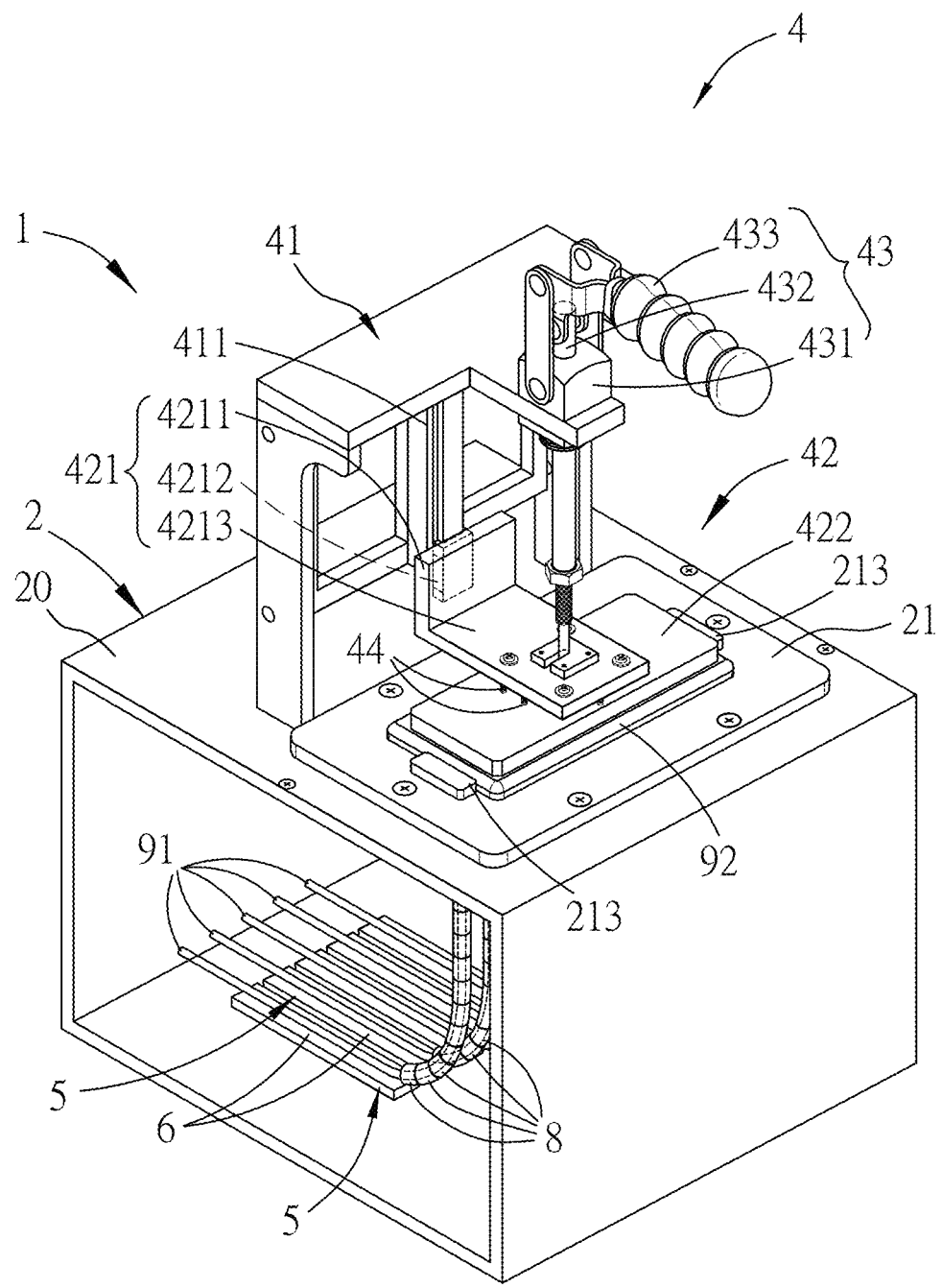
FIG. 4 is a perspective view showing the embodiment when the electronic DUT is pressed by a press plate in a depressing position.

The press plate unit 42 is disposed above the carrier plate 21. The press plate unit 42 is connected movably to the supporting frame 41 in a manner that the press plate unit 42 is vertically movable relative to the supporting frame 41 between a depressing position and a releasing position. In this embodiment, the press plate unit 42 includes an L-shaped guide plate 421 and a press plate 422. The guide plate 421 has an upright plate portion 4211 that is formed with a rail-engaging member 4212 engaging slidably the guiding rail member 411 of the supporting frame 41, and a horizontal plate portion 4213 that is connected to the actuating unit 43. In this embodiment, the press plate 422 is floatingly connected to the horizontal plate portion 4213 of the guide plate 421 by means of a plurality of springs 44, which are connected therebetween to serve as cushioning pieces. The press plate 422 is parallel to the horizontal plate portion 4213 of the guide plate 421, and is located between the horizontal plate portion 4213 of the guide plate 421 and the carrier plate 21. When the press plate unit 42 is in the depressing position, as shown in FIG. 4, the electronic DUT 92 is directly pressed by the press plate 422 of the press plate unit 42 toward the carrier plate 21 to urge the antenna element unit 921 of the electronic DUT 92 to contact tightly the upper ends 221 of the resilient terminals 22. When the press plate unit 42 is in the releasing position, as shown in FIG. 3, the electronic DUT 92 is released from the press plate unit 42.

The actuating unit 43 is mounted to the supporting frame 41, and is connected to the press plate unit 42. The actuating unit 43 is operable to actuate the press plate unit 42 from one of the depressing and releasing positions to the other one of the depressing and releasing positions. In this embodiment, the actuating unit 43 may include a mounting seat 431 that is fixed to the supporting frame 41, a toggle arm 433 that is pivotally connected to the mounting seat 431, and an actuating rod 432 that extends uprightly through the mounting seat 431 and that has an upper end pivotally connected to the toggle arm 433, and a lower end connected to the horizontal plate portion 4213 of the guide plate 421. When the toggle arm 433 rotates relative to the mounting seat 431, the actuating rod 432 is driven by the toggle arm 433 to upwardly or downwardly move relative to the mounting seat 431 such that the press plate unit 42 is actuated by the actuating rod 432 to moves into the releasing or depressing position.

Figure 6:
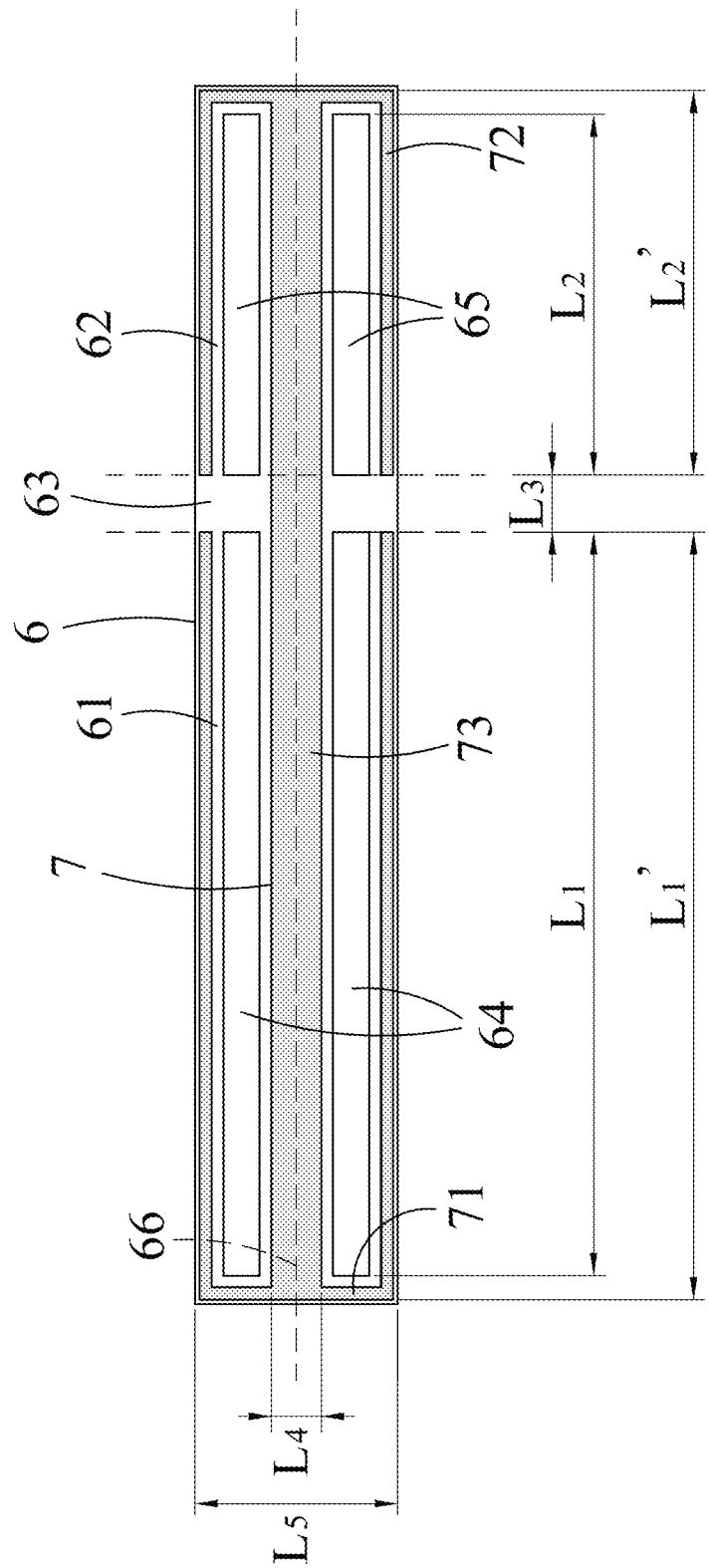
FIG. 6 is a schematic view showing a planar dielectric board and a metal layer of the embodiment.
Figure 7:
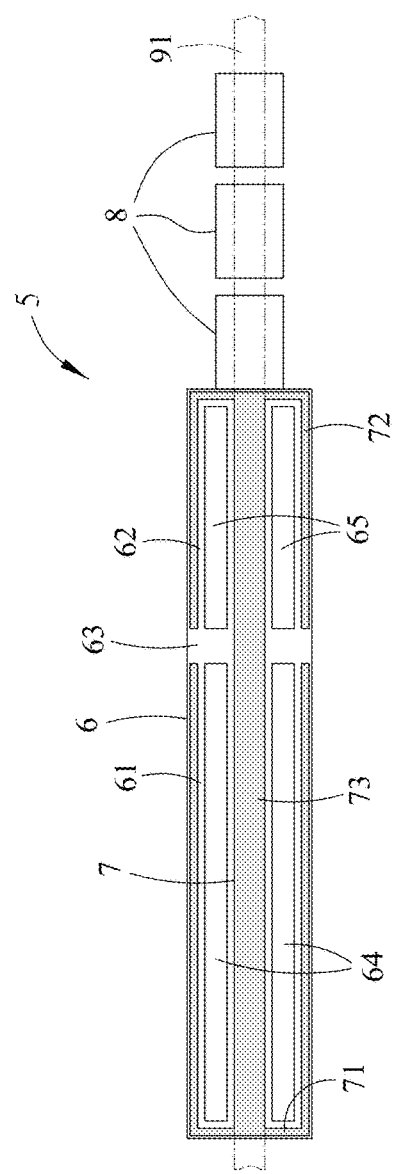
FIG. 7 is a schematic view showing an RF interference choke device of the embodiment.

Referring to FIGS. 6 and 7, each RF interference choke device 5 is mounted to a respective coaxial cable 91 for reducing transmission of RF interference signals originating from outside of the respective coaxial cable 91. The RF interference signals are regarded as noises and each have a frequency within one of a first frequency band and a second frequency band, which are different from each other. In this embodiment, the first frequency band is lower than the second frequency band. Each RF interference choke device 5 includes a planar dielectric board 6, a metal layer 7 and a plurality of magnetic ferrite beads 8. Detailed descriptions of each RF interference choke device 5 are provided in the following.

The planar dielectric board 6 has a first board portion 61, a second board portion 62 and a third portion 63. The second board portion 62 is opposite to the first board portion 61 in a lengthwise direction of the dielectric board 6. The third board portion 63 interconnects the first and second board portions 61, 62. The first board portion 61 is formed with two elongate first slots 64 that extend in the lengthwise direction and that are arranged symmetrically about a central line 66 of the dielectric board 6 parallel to the lengthwise direction. The second board portion 62 is formed with two elongate second slots 65 that extend in the lengthwise direction and that are arranged symmetrically about the central line 66. The third board portion 63 is defined among the first slots 64 and the second slots 65. In this embodiment, the dielectric board 6 is made of a dielectric material, such as FR-4 which is to retain the high mechanical values and electrical insulating qualities in both dry and humid conditions, that has a dielectric constant associated with a first length ($L_1$) of the first slots 64 and a second length ($L_2$) of the second slots 65. In addition, the dielectric board 6, the first slots 64 and the second slots 65 may be substantially rectangular. It should be noted that the first length ($L_1$) of the first slots 64 is substantially equal to quarter wavelength ($\lambda_1$) at a center frequency of the first frequency band, and the second length ($L_2$) of the second slots 65 is substantially equal to quarter wavelength ($\lambda_2$) at a center frequency of the second frequency band. Therefore, the first length ($L_1$) and the second length ($L_2$) can be represented by the following equation (1):

$$L_i \approx \frac{\lambda_i}{4}, \qquad \text{equation (1)}$$

where i={1, 2}.

The metal layer 7 is attached to the dielectric board 6, and connects with the respective coaxial cable 91. The metal layer 7 has a U-shaped first pattern 71 that is disposed on the first board portion 61 and that surrounds the first slots 64, a U-shaped second pattern 72 that is disposed on the second board portion 62 and that surrounds the second slots 65, and a strip-shaped third pattern 73 that extends along the central line 66 and that interconnects integrally the first and second patterns 71, 72. In this embodiment, since the U-shaped first pattern 71 surrounds the first slots 64 and the U-shaped second pattern 72 surrounds the second slots 65, lengths thereof ($L_1'$) and ($L_2'$) are also respectively and substantially equal to the quarter wavelengths ($\lambda_1$) and ($\lambda_2$). A distance ($L_3$) between the first and second board portions 61, 62 is, for example, but not limited to, 5 mm. A width ($L_4$) of the strip-shaped third pattern 73 is associated with a diameter of the respective coaxial cable 91; for example, the width ($L_4$) is proportional to the diameter of the respective coaxial cable 91. In this embodiment, the width ($L_4$) is equal to the diameter of the respective coaxial cable 91. A width ($L_5$) of the planar dielectric board 6 is, for example, but not limited to, substantially twice the width ($L_4$). The metal layer 7 permits the respective coaxial cable 91 to extend across the metal layer 7 along the central line 66 of the dielectric board 6.

It is noted that the relationship among the speed (V) of light, the dielectric constant, i.e., relative permittivity ($\in_r$) of the dielectric board 6, the antenna frequency ($f_1$) or ($f_2$) and the wavelength ($\lambda_1$) or ($\lambda_2$) of one of the RF interference signals transmitted over the metal layer 7 can be represented by the following equation (2):

$$V = f_i * \lambda_i * \sqrt{\in_r}, \qquad \text{equation (2),}$$

where i={1, 2}.

The speed of light is $3 \times 10^8$ m/s and, the $\in_r$ is, for example, equal to 4.4 when the dielectric board 6 is made of FR-4. According to equations (1) and (2), the frequency of the one of the RF interference signals can be obtained.

The magnetic ferrite beads 8 of each RF interference choke device 5 are sleeved on the respective coaxial cable 91, and are disposed adjacent to the planar dielectric board 6 to suppress undesirable radiation for lower frequencies, for example, frequencies less than 500 MHz. It is noted that the RF interference choke device 5 may not include the magnetic ferrite beads 8 in other embodiments.

In use, the electronic DUT 92 is first attached to the top surface 211 of the carrier plate 21 (see FIG. 3) so that the upper end 221 of each resilient terminal 22 contacts the corresponding antenna element (921a), (921b), (921c), (921d), (921e) of the electronic DUT 92 (see FIG. 1). Then, the actuating unit 43 is operated to actuate the press plate unit 42 from the releasing position to the depressing position (see FIG. 4) so that the upper end 221 of each resilient terminal 22 can contact tightly the corresponding antenna element (921a), (921b), (921c), (921d), (921e) of the electronic DUT 92. Thereafter, the coaxial cables 91 may be connected to an external network analyzer (not shown), for example, one by one, so that one or more test signals are transmitted from the network analyzer to the electronic DUT 92 via the impedance matching circuit board 3. Accordingly, the network analyzer can receive from the electronic DUT 92 one or more response signals corresponding to the test signal(s) via the RF testing apparatus 1, thereby obtaining character parameters, for example, S11 parameter, for evaluating the antenna performance of the electronic DUT 92.

Figure 8:
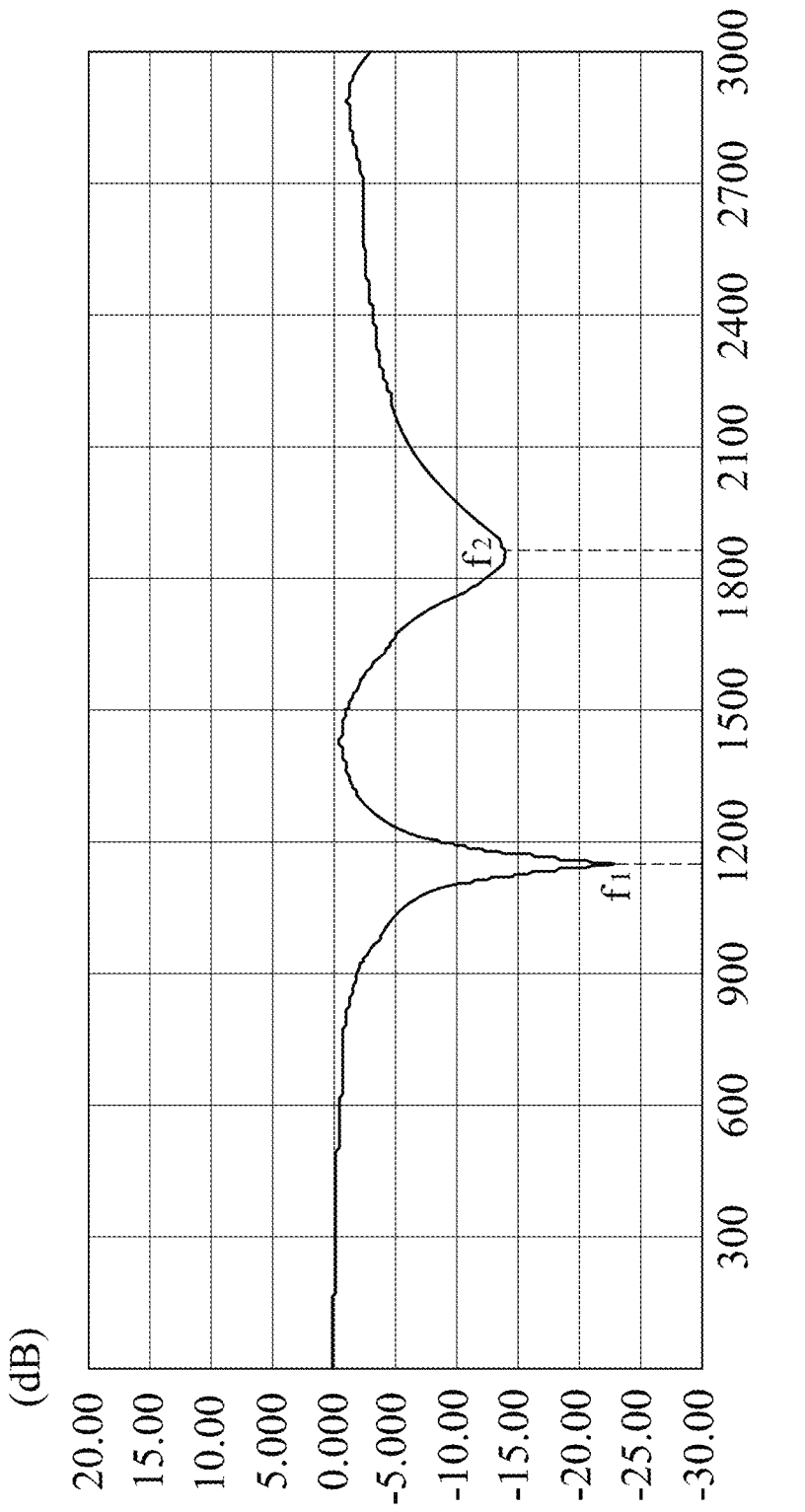
FIG. 8 is a plot illustrating an experimental measurement result of S11 parameter of the electronic DUT when the electronic DUT is tested by the embodiment.
Figure 9:
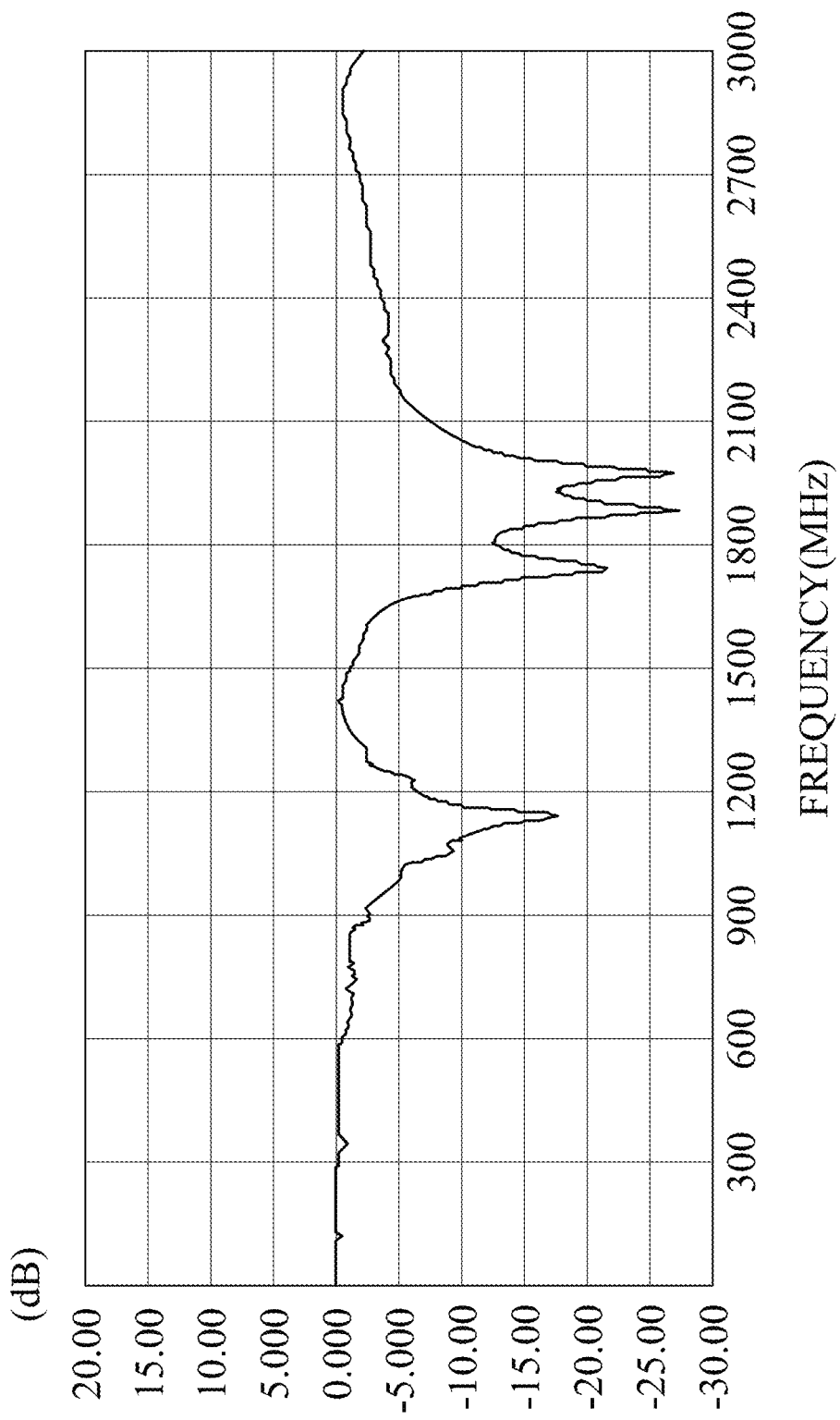
FIG. 9 is a plot illustrating an experimental measurement result of S11 parameter of the electronic DUT when the electronic DUT is tested by the embodiment without any RF interference choke device.
Figure 10:
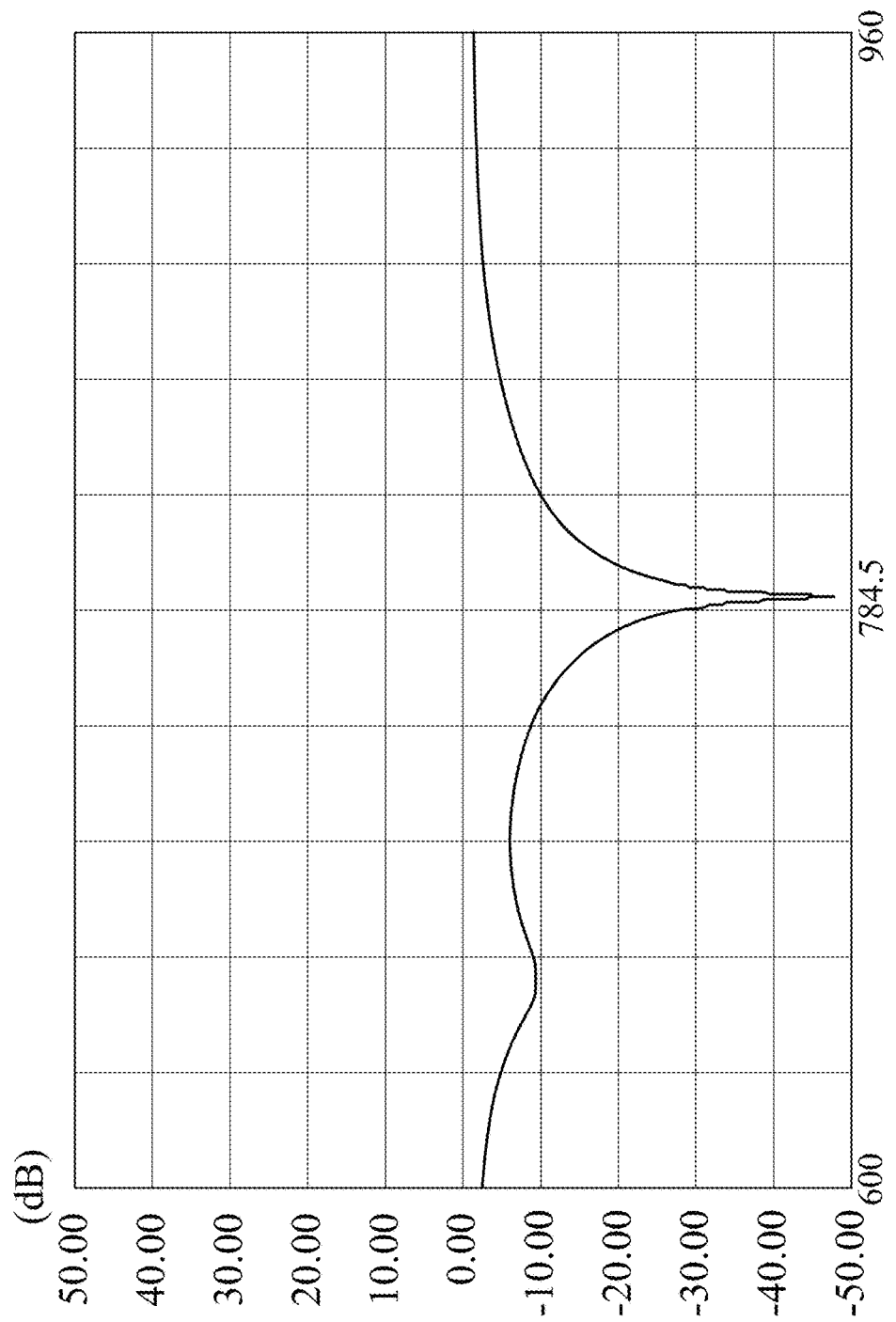
FIG. 10 is a plot illustrating an experimental measurement result of S11 parameter of another electronic DUT when the electronic DUT is tested by the embodiment.
Figure 11:
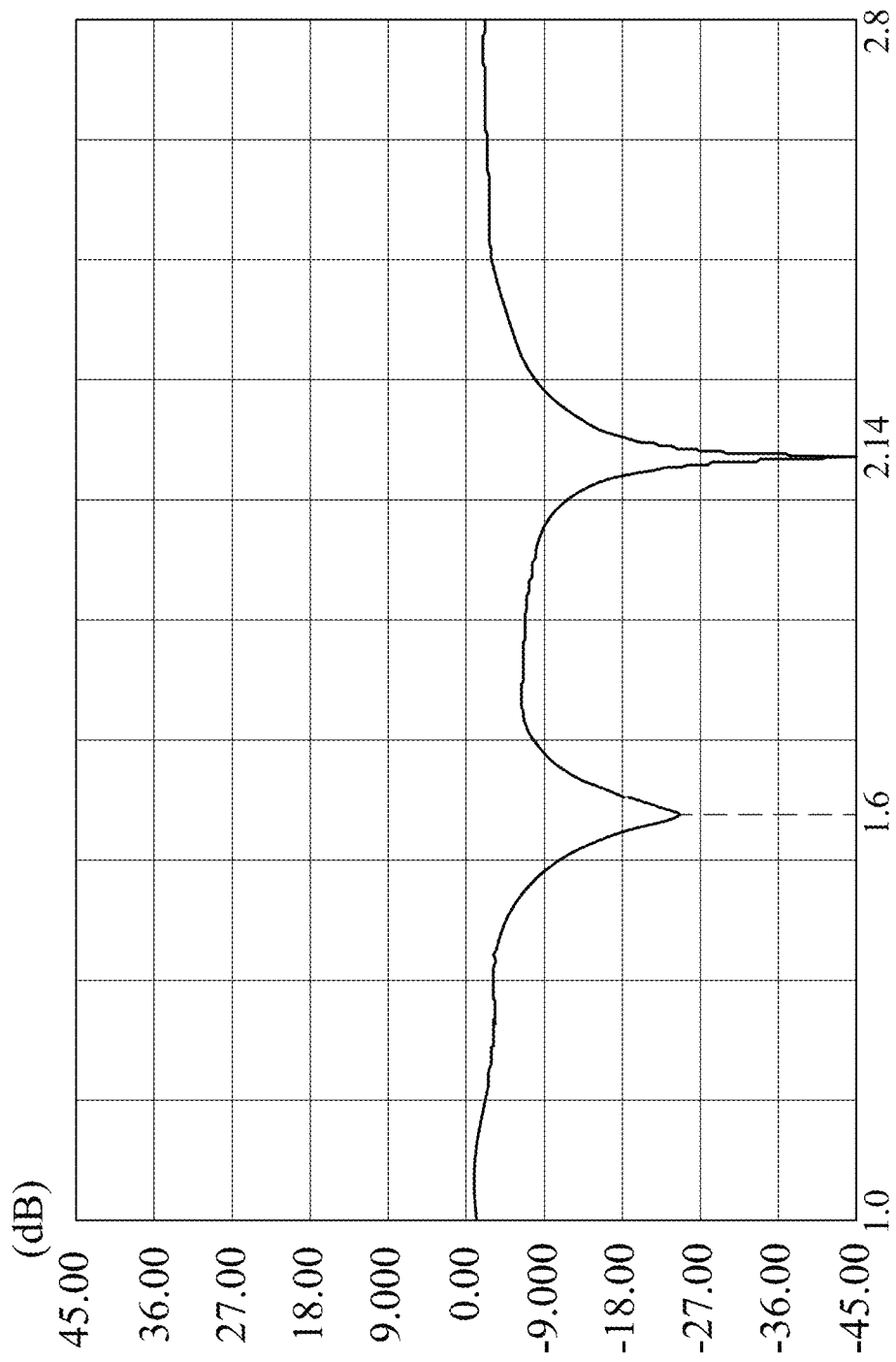
FIG. 11 is a plot illustrating an experimental measurement result of S11 parameter of another electronic DUT when the electronic DUT is tested by the embodiment.
Figure 12:
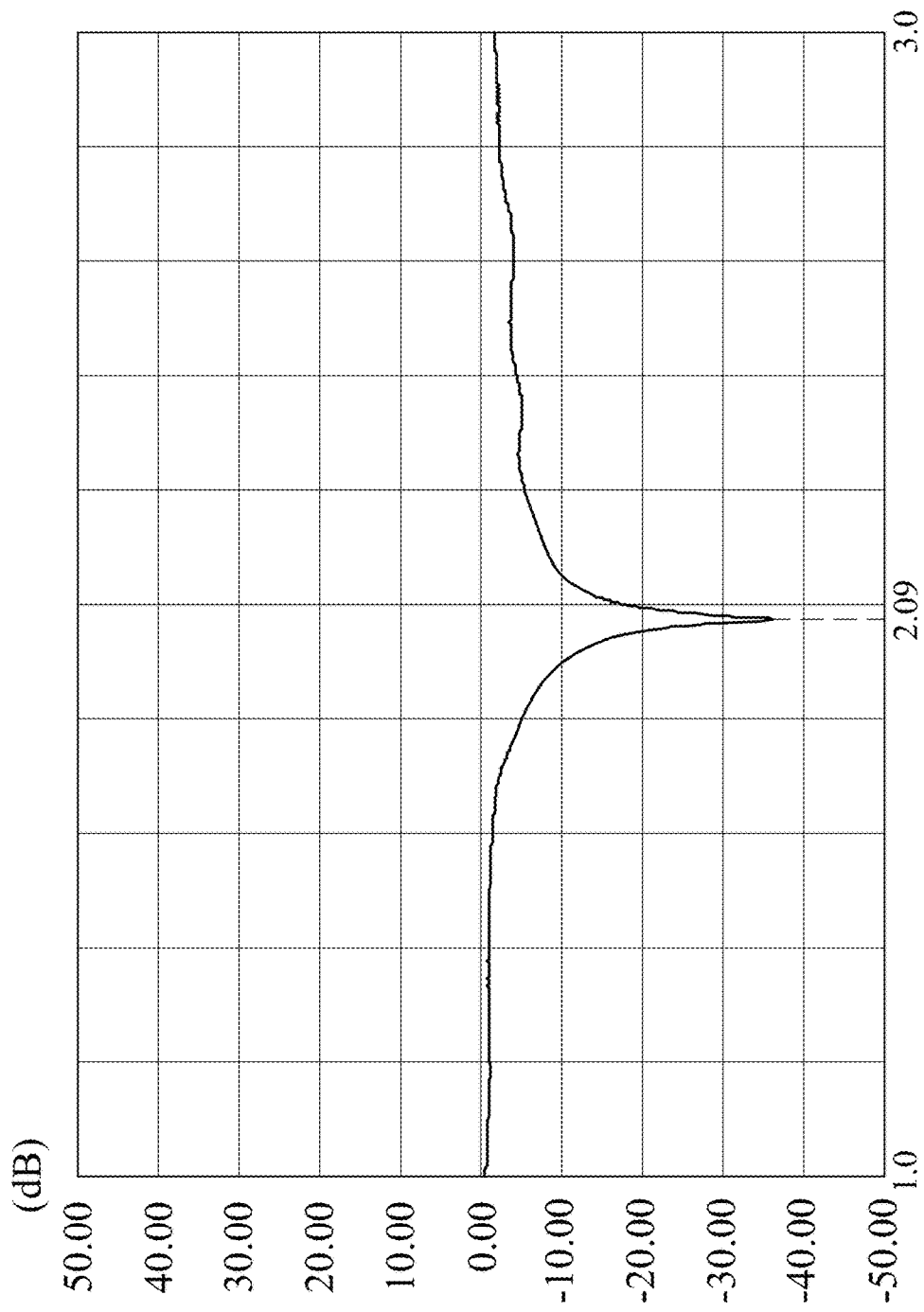
FIG. 12 is a plot illustrating an experimental measurement result of S11 parameter of another electronic DUT when the electronic DUT is tested by the embodiment.
Figure 13:
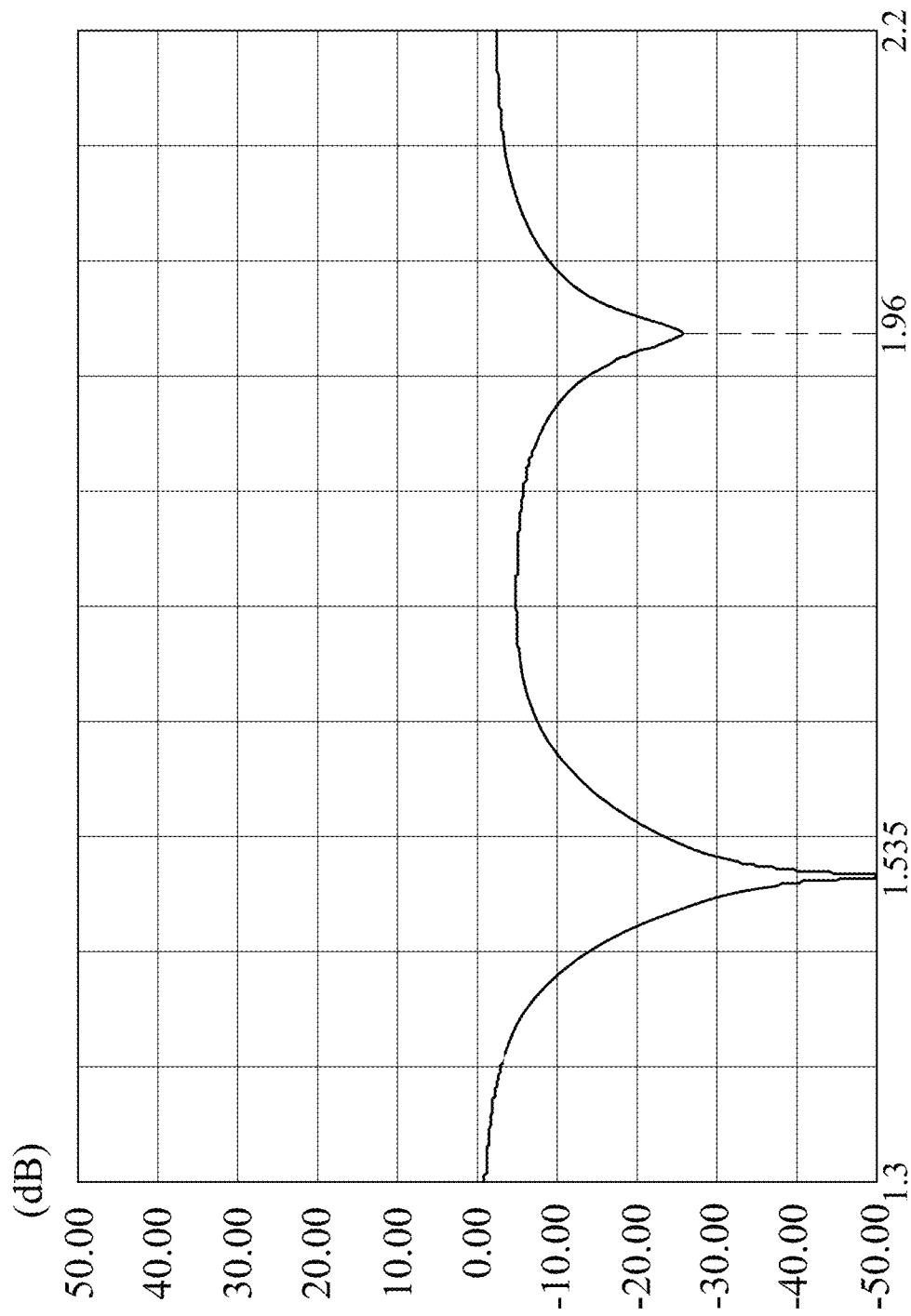
FIG. 13 is a plot illustrating an experimental measurement result of S11 parameter of another electronic DUT when the electronic DUT is tested by the embodiment.
Figure 14:
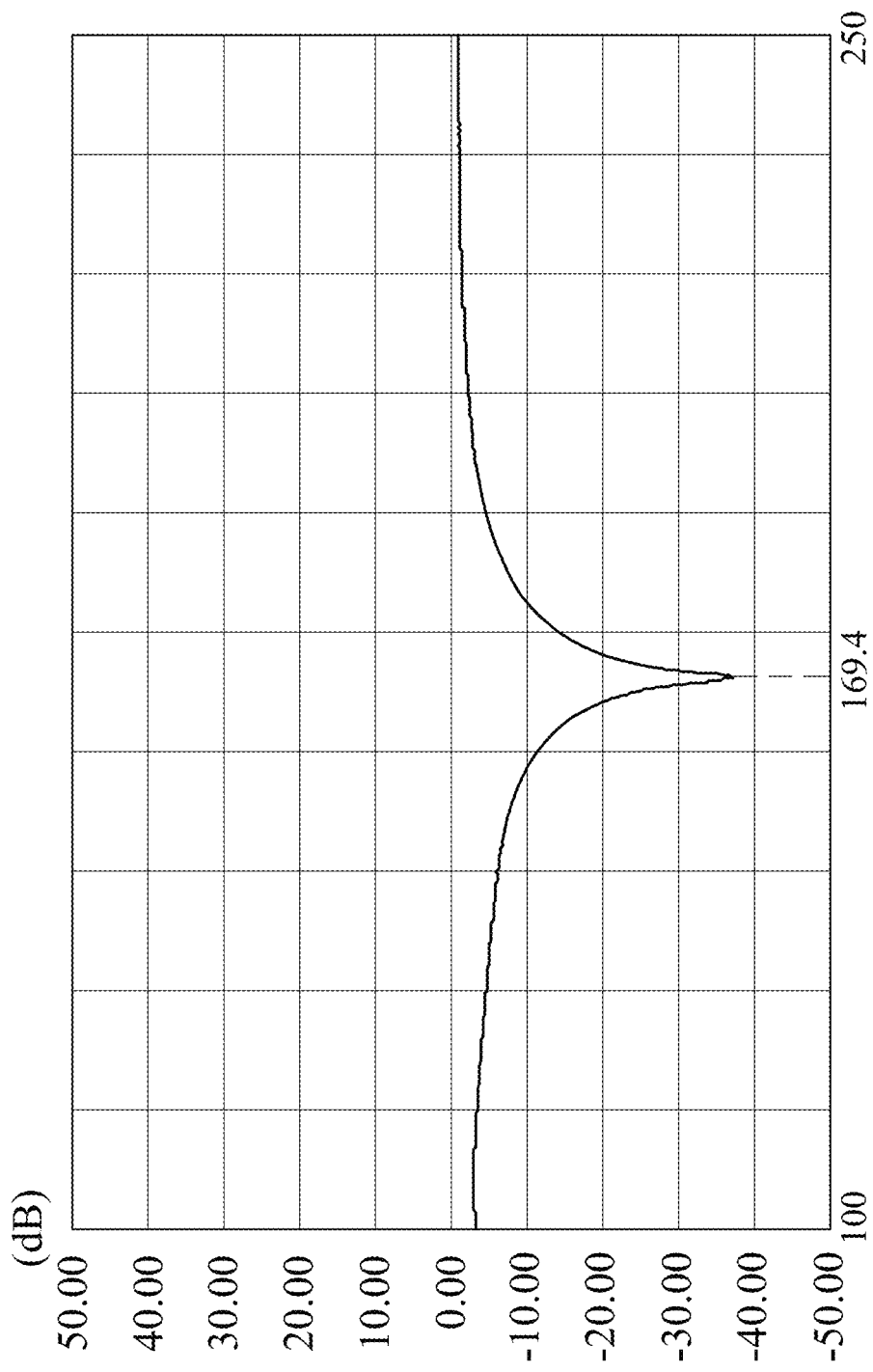
FIG. 14 is a plot illustrating an experimental measurement result of S11 parameter of another electronic DUT when the electronic DUT is tested by the embodiment.

FIG. 8 illustrates an experimental measurement result of S11 parameter of the electronic DUT 92 when the electronic DUT 92 is tested by the RF testing apparatus 1 of this disclosure, and FIG. 9 illustrates an experimental measurement result of S11 parameter of the electronic DUT 92 when the electronic DUT 92 is tested by the RF testing apparatus 1 without the RF interference choke devices 5. In particular, S11 parameter represents how much power is reflected from the antenna element unit 921, and hence is known as the reflection coefficient or return loss. If S11=0 dB, then all the power is reflected from the antenna element unit 921 and nothing is radiated.

In this embodiment, the first center frequency (f1) of the first frequency band of the antenna elements (921a), (921b), (921c), (921d) and (921e) is 1150 MHz, and the second center frequency (f2) of the second frequency band of the antenna elements (921a), (921b), (921c), (921d) and (921e) is 1900 MHz. The first frequency band ranges from 1050 MHz to 1250 MHz but is not limited thereto, and the second frequency band ranges from 1800 MHz to 2000 MHz but is not limited thereto. According to equation (2), $\lambda_1$ and $\lambda_2$ are respectively equal to 124.36 mm and 75.27 mm. According to equation (1), $L_1$ and $L_2$ are respectively equal to 31.09 mm and 18 mm, and $L_1'$ and $L_2'$ may be respectively equal to 32 mm and 18.82 mm. In FIGS. 8 and 9, the Y axis represents the magnitude of S11 parameter in dB, and the X axis represents the frequency. From FIGS. 8 and 9, it is evident that there are more ripples on the measurement result of S11 parameter in FIG. 9. In other words, the RF interference choke devices 5 can effectively reduce transmission of RF interference signals in the first and second frequency bands, especially, of the RF interference signal(s) resulting from electromagnetic coupling among the coaxial cables 91. It is noted that the first and second lengths ($L_1$, $L_2$) of the first and second slots 64, 65 of each RF interference choke device 5 may be designed to conform with a corresponding antenna element (921a), (921b), (921c), (921d), (921e) of the electronic DUT 92.

FIGS. 10 to 14 illustrate the experimental measurement results of S11 parameter of other electronic DUTs when the electronic DUTs are tested by the RF testing apparatus 1 of this disclosure. The experimental measurement results illustrate that the RF interference choke device 5 can operate at frequencies ranging from 100 MHz to 3 GHz.

To sum up, the RF testing apparatus 1 of this disclosure is flexible to test electronic DUTs 92 with different kinds of antenna element units 921 by changing the carrier plate 21. In addition, due to the presence of the press mechanism 4, tight electrical connection between the impedance matching circuit board 3 and the electronic DUT 92 can be effectively achieved, thereby ensuring a stable measurement result. Furthermore, the RF interference choke device 5 can effectively reduce RF interference signals within two different frequency bands, and can be easily fabricated by a low-cost process.

While the present disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A radio frequency (RF) interference choke device for reducing transmission of RF interference signals originating from outside of a coaxial cable, each having a frequency within one of a first frequency band and a second frequency band that are different from each other, said RF interference choke device comprising:

a planar dielectric board having a first board portion, a second board portion that is opposite to said first board portion in a lengthwise direction of said dielectric board, and a third board portion that interconnects said first and second board portions, said first board portion being formed with two elongate first slots that extend in the lengthwise direction, that are arranged symmetrically about a central line of said dielectric board parallel to the lengthwise direction and that have a first length associated with the first frequency band, said second board portion being formed with two elongate second slots that extend in the lengthwise direction, that are arranged symmetrically about the central line and that have a second length associated with the second frequency band, said third board portion being defined between said first and second slots; and a metal layer that is attached to said dielectric board and that is used to connect with the coaxial cable, said metal layer having a U-shaped first pattern that is disposed on said first board portion and that surrounds said first slots, a U-shaped second pattern that is disposed on said second board portion and that surrounds said second slots, and a strip-shaped third pattern that extends along the central line and that interconnects integrally said first and second patterns.

2. The RF interference choke device as claimed in claim 1, wherein said dielectric board is made of a dielectric material that has a dielectric constant associated with the first length of said first slots and the second length of said second slots.

3. The RF interference choke device as claimed in claim 1, wherein said dielectric board, said first slots and said second slots are substantially rectangular in shape.

4. The RF interference choke device as claimed in claim 1, the first frequency band being lower than the second frequency band, wherein:

the first length of said first slots is substantially equal to quarter wavelength at a center frequency of the first frequency band; and the second length of said second slots is shorter than the first length of said first slots, and is substantially equal to quarter wavelength at a center frequency of the second frequency band.

5. The RF interference choke device as claimed in claim 1, wherein said metal layer permits the coaxial cable to extend across said metal layer along the central line of said dielectric board.

6. The RF interference choke device as claimed in claim 1, further comprising at least one magnetic ferrite bead used to be sleeved on the coaxial cable and disposed adjacent to said planar dielectric board.

7. The RF interference choke device as claimed in claim 1, wherein said strip-shaped third pattern of said metal layer has a width that is associated with a diameter of the coaxial cable.

8. The RF interference choke device as claimed in claim 7, wherein said planar dielectric board has a width that is substantially twice the width of said strip-shaped third pattern of said metal layer.

9. A radio frequency (RF) testing apparatus for an electronic device under test (DUT) that includes an antenna element unit, said RF testing apparatus comprising:
a platform used to support the electronic DUT thereon; an impedance matching circuit board mounted to said platform and used to be electrically connected to the antenna element unit of the electronic DUT when the electronic DUT is disposed on said platform for providing impedance matching between the antenna element unit and at least one coaxial cable, which is electrically connected to said impedance matching circuit board to serve as a transmission line for signals transmitted to or outputted from the antenna element unit of the electronic DUT; and
at least one RF interference choke device mounted to said at least one coaxial cable for reducing transmission of RF interference signals originating from outside of said at least one coaxial cable, each of the RF interference signals having a frequency within one of a first frequency band and a second frequency band that are different from each other, each of said at least one RF interference choke device including a planar dielectric board having a first board portion, a second board portion that is opposite to said first board portion in a lengthwise direction of said dielectric board, and a third board portion that interconnects said first and second board portions, said first board portion being formed with two elongate first slots that extend in the lengthwise direction, that are arranged symmetrically about a central line of said dielectric board parallel to the lengthwise direction and that have a first length associated with the first frequency band, said second board portion being formed with two elongate second slots that extend in the lengthwise direction, that are arranged symmetrically about the central line and that have a second length associated with the second frequency band, said third board portion being defined between said first and second slots, and
a metal layer that is attached to said dielectric board and that connects with a respective one of said at least one coaxial cable, said metal layer having a U-shaped first pattern that is disposed on said first board portion and that surrounds said first slots, a U-shaped second pattern that is disposed on said second board portion and that surrounds said second slots, and a strip-shaped third pattern that extends along the central line and that interconnects integrally said first and second patterns.

10. The RF testing apparatus as claimed in claim 9, wherein said platform includes a carrier plate, said carrier plate having a top surface used to support the electronic DUT thereon, and a bottom surface opposite to said top surface and provided with said impedance matching circuit board thereon, said carrier plate being provided with a plurality of resilient terminals, each of said resilient terminals extending through said carrier plate and having an upper end, which extends out of said top surface of said carrier plate and which is used to contact the antenna element unit of the electronic DUT when the electronic DUT is attached to said top surface of said carrier plate, and a lower end, which extends out of said bottom surface of said carrier plate and which is electrically connected to said impedance matching circuit board.

11. The RF testing apparatus as claimed in claim 10, the electronic DUT being formed with a recess, wherein said top surface of said carrier plate is formed with a positioning protrusion that permits said upper ends of said resilient terminals to extend outwardly thereof and that is used to fittingly engage the recess in the electronic DUT.

12. The RF testing apparatus as claimed in claim 10, further comprising a press mechanism disposed on said platform for pressing, when testing, the electronic DUT in a manner that said upper ends of said resilient terminals contact tightly the antenna element unit of the electronic DUT.

13. The RF testing apparatus as claimed in claim 12, wherein said press mechanism includes:
a supporting frame disposed on said platform;
a press plate unit disposed above said carrier plate and connected movably to said supporting frame in a manner that said press plate unit is vertically movable relative to said supporting frame between a depressing position, where the electronic DUT is pressed by said press plate unit toward said carrier plate to urge the antenna element unit of the electronic DUT to contact tightly said upper ends of said resilient terminals, and a releasing position, where the electronic DUT is released from said press plate unit; and
an actuating unit mounted to said supporting frame and connected to said press plate unit, said actuating unit being operable to actuate said press plate unit from one of the depressing and releasing positions to the other one of the depressing and releasing positions.

14. The RF testing apparatus as claimed in claim 13, wherein, for said press mechanism:
said supporting frame includes an uprightly extending guiding rail member; and
said press plate unit includes
an L-shaped guide plate having an upright plate portion that is formed with a rail-engaging member engaging slidably said guiding rail member of said supporting frame, and a horizontal plate portion that is connected to said actuating unit, and
a press plate connected to and parallel to said horizontal plate portion of said guide plate, and used to directly press the electronic DUT when said press plate unit is in the depressing position.

15. The RF testing apparatus as claimed in claim 10, the antenna element unit including a plurality of antenna elements,
said RF testing apparatus comprising a plurality of said RF interference choke devices, said impedance matching circuit board being connected electrically to a plurality of the coaxial cables, each of said RF interference choke devices being mounted to a respective one of the coaxial cables;
wherein said impedance matching circuit board includes a circuit board that is fixed to said bottom surface of said carrier plate and that is formed with a plurality of spaced apart conductive traces, and a ground pattern spaced apart from said conductive traces, said circuit board being provided with a plurality of electrical connectors, each of which interconnects electrically a respective one of said conductive traces and a respective one of the coaxial cables; and
wherein said resilient terminals are arranged in a manner that said upper end of each of said resilient terminals is used to contact a corresponding one of the antenna elements of the antenna element unit of the electronic DUT and that said lower end of each of said resilient terminals extends through said circuit board and is connected electrically to a corresponding one of said conductive traces and said ground pattern.

16. The RF testing apparatus as claimed in claim 9, wherein said dielectric board of each of said at least one RF interference choke device is made of a dielectric material that has a dielectric constant associated with the first length of said first slots and the second length of said second slots.

17. The RF testing apparatus as claimed in claim 9, wherein, for each of said at least one RF interference choke device, said dielectric board, said first slots and said second slots are substantially rectangular in shape.

18. The RF testing apparatus as claimed in claim 9, the first frequency band being lower than the second frequency band, wherein, for each of said at least one RF interference choke device:
the first length of said first slots is substantially equal to quarter wavelength at a center frequency of the first frequency band; and
the second length of said second slots is shorter than the first length of said first slots, and is substantially equal to quarter wavelength at a center frequency of the second frequency band.

19. The RF testing apparatus as claimed in claim 9, wherein, for each of said at least one RF interference choke device, said metal layer permits the respective one of said at least one coaxial cable to extend across said metal layer along the central line of said dielectric board.

20. The RF testing apparatus as claimed in claim 19, wherein each of said at least one RF interference choke device further includes at least one magnetic ferrite bead sleeved on the respective one of said at least one coaxial cable and disposed adjacent to said dielectric board.

21. The RF testing apparatus as claimed in claim 9, wherein said strip-shaped third pattern of said metal layer has a width that is associated with a diameter of said at least one coaxial cable.

22. The RF testing apparatus as claimed in claim 17, wherein said planar dielectric board has a width that is substantially twice the width of said strip-shaped third pattern of said metal layer.

* * * * *